(12) United States Patent
Patrie et al.

(10) Patent No.: US 6,219,305 B1
(45) Date of Patent: Apr. 17, 2001

(54) METHOD AND SYSTEM FOR MEASURING SIGNAL PROPAGATION DELAYS USING RING OSCILLATORS

(75) Inventors: Robert D. Patrie, Scotts Valley; Robert W. Wells, Cupertino; Steven P. Young; Christopher H. Kingsley, both of San Jose; Daniel Chung, San Jose; Robert O. Conn, Los Gatos, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/114,369

(22) Filed: Jul. 14, 1998

Related U.S. Application Data

(63) Continuation-in-part of application No. 08/710,465, filed on Sep. 17, 1996, now Pat. No. 5,790,479.

(51) Int. Cl.$^7$ ............................... G04F 8/00; G08B 1/08; G01R 31/317; G06F 11/00
(52) U.S. Cl. ............................ 368/113; 368/118; 368/120; 324/617; 324/763; 324/765; 714/733
(58) Field of Search .................. 368/110–113, 118–120; 327/265; 324/73 R, 73 AT, 76.77, 76.8, 617, 763, 765; 371/22.1, 22.5, 25.1, 27, 28; 714/733

(56) References Cited

U.S. PATENT DOCUMENTS

| | | | |
|---|---|---|---|
| Re. 34,363 | 8/1993 | Freeman | 307/465 |
| 4,510,429 | 4/1985 | Squire | 318/696 |

(List continued on next page.)

OTHER PUBLICATIONS

"The Programmable Logic Data Book," 1998, available from Xilinx, Inc., 2100 Logic Drive, San Jose, California 95124, pp. 4–5 to 4–40.

"Signal Delay in RC Tree Networks," IEEE Transactions on Computer–Aided Design, vol. CAD–2, No. 3, Jul. 1983, pp. 202–211.

Application Note from Xilinx, Inc., "Efficient Shift Registers, LFSR Counters, and Long Pseudo–Random Sequence Generators," by Peter Alfke, Jul. 7, 1996.

*Primary Examiner*—Vit Miska
(74) *Attorney, Agent, or Firm*—Arthur J. Behiel; Edel M. Young

(57) ABSTRACT

A circuit measures the signal propagation delay through a selected test circuit. The test circuit is provided with an inverting feedback path so that the test circuit and feedback path together form a free-running oscillator. The oscillator then automatically provides its own test signal that includes alternating rising and falling signal transitions on the test-circuit input node. These signal transitions are counted over a predetermined time period to establish the average period of the oscillator. Finally, the average period of the oscillator is related to the average signal propagation delay through the test circuit. One embodiment of the invention includes a phase discriminator that samples the output of the oscillator and accumulates data representing the duty cycle of that signal. The duty cycle can then be combined with the average period of the test signal to determine, separately, the delays associated with falling and rising edges propagating through the test circuit.

32 Claims, 7 Drawing Sheets

U.S. PATENT DOCUMENTS

| | | | |
|---|---|---|---|
| 4,792,932 | 12/1988 | Bowhers et al. | 368/113 |
| 4,795,964 | 1/1989 | Shetti | 324/60 |
| 4,878,209 | 10/1989 | Bassett et al. | 368/113 |
| 4,890,270 | 12/1989 | Griffith | 368/113 |
| 5,048,064 | 9/1991 | Rutherford | 377/20 |
| 5,083,299 * | 1/1992 | Schwanke et al. | 368/113 |
| 5,097,208 * | 3/1992 | Chiang | 324/158 R |
| 5,181,191 | 1/1993 | Farwell | 368/113 |
| 5,294,559 | 3/1994 | Dethimy | 307/480 |
| 5,351,211 | 9/1994 | Higeta et al. | |
| 5,581,738 | 12/1996 | Dombrowski | 395/500 |
| 5,606,567 | 2/1997 | Agrawal et al. | 371/22.4 |
| 5,625,288 | 4/1997 | Snider et al. | 324/158 |
| 5,818,250 * | 10/1998 | Yeung et al. | 324/763 |
| 5,845,233 | 12/1998 | Fishburn | 702/108 |
| 5,923,676 * | 7/1999 | Sunter et al. | 371/22.5 |
| 6,057,691 * | 5/2000 | Kosatashi | 324/617 |

* cited by examiner

METHOD AND SYSTEM FOR MEASURING SIGNAL PROPAGATION DELAYS USING RING OSCILLATORS

CROSS REFERENCE TO RELATED APPLICATIONS

This application is a continuation-in-part of U.S. patent application Ser. No. 08/710,465, entitled "Method for Characterizing Interconnect Timing Characteristics Using Reference Ring Oscillator Circuit," by Robert O. Conn, filed Sep. 17, 1996, now U.S. Pat. No. 5,790,479. This application is related to U.S. patent application Ser. No. 09/115,204, entitled "Built-In Self Test Method For Measuring Clock to Out Delays," by Robert W. Wells, Robert D. Patrie, and Robert O. Conn filed herewith, and U.S. Pat. No. 6,069,849, entitled "Method and System for Measuring Signal Propagation Delays Using the Duty Cycle of a Ring Oscillator," by Christopher H. Kingsley, Robert W. Wells, and Robert D. Patrie, filed herewith. The foregoing documents are incorporated herein by reference.

FIELD OF THE INVENTION

This invention relates generally to methods and circuit configurations for measuring signal propagation delays, and in particular for measuring signal propagation delays through integrated circuits.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that guarantee superior speed performance. This leads IC manufacturers to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 to output pin 140. The resulting time period is the timing parameter for the path of interest. Such parameters are typically published in literature associated with particular ICs or used to model the speed performance of circuit designs that employ the path of interest.

Conventional test procedures are problematic for at least two reasons. First, many signal paths within a given IC cannot be measured directly, leading to some speculation as to their true timing characteristics. Second, testers have tolerances that can have a significant impact on some measurements, particularly when the signal propagation time of interest is short. For example, if the tester is accurate to one nanosecond and the propagation delay of interest is measured to be one nanosecond, the actual propagation delay might be any time between zero and two nanoseconds. In such a case the IC manufacturer would have to list the timing parameter as two nanoseconds, the worst-case scenario. If listed timing parameters are not worst-case values, some designs may fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

Programmable logic devices (PLDS) are a well-known type of digital integrated circuit that may be programmed by a user (e.g., a circuit designer) to perform specified logic functions. One type of PLD, the field-programmable gate array (FPGA), typically includes an array of configurable logic blocks, or CLBs, that are programmably interconnected to each other and to programmable input/output blocks (IOBs). This collection of configurable logic may be customized by loading configuration data into internal configuration memory cells that, by determining the states of various programming points, define how the CLBs, interconnections, and IOBs are configured.

Each programming point, CLB, interconnection line, and IOB introduces some delay into a signal path. The many potential combinations of these and other delay-inducing elements make timing predictions particularly difficult. FPGA designers use circuit models, called "speed files," that include delay values or resistance and capacitance values for the various delay-inducing elements that can be combined to form desired signal paths. These circuit models are then used to predict circuit timing for selected FPGA configurations.

Manufacturers of ICs, including FPGAs, would like to guarantee the highest speed timing specifications possible without causing FPGAs to fail to meet timing specifications. More accurate measurements of circuit timing allow IC manufacturers to use smaller guard bands to ensure correct device performance, and therefore to guarantee higher speed performance. There is therefore a need for a more accurate means of characterizing IC speed performance.

SUMMARY

The present invention addresses the need for an accurate means of characterizing IC speed performance. The inventive circuit is particularly useful for testing programmable logic devices, which can be programmed to include a majority of the requisite test circuitry.

In accordance with the invention, a PLD is configured to implement a free-running ring oscillator within the elements of the PLD to be tested. That is, the PLD is programmed to form a loop through PLD elements to be tested, with an odd number of inversions in the loop so that a signal switches on every cycle through the loop. The oscillator then automatically provides its own test signal that includes alternating rising and falling signal transitions, or edges, on the test-circuit input node. These signal transitions are counted over a predetermined time period to establish the average period of the oscillator. The average period of the oscillator is then related to the average signal propagation delay through the test circuit.

Signal paths often exhibit different propagation delays for falling and rising edges, due, for example, to unbalanced driver circuits. The trouble with providing average propagation delays is that the worst-case delay is greater than the average. Consider, for example, the case where a signal path delays falling edges by 2 nanoseconds and rising edges by 3 nanoseconds. The average, 2.5 nanoseconds, is shorter than the worst-case delay associated with rising edges. Unfortunately, the average delay does not indicate whether the delays associated with falling and rising edges are different. Thus, when only the average delay is being measured, a conservative guard band must be added to the average delay.

Another embodiment of the invention reduces the requisite guard band by providing more accurate delay measurements. This embodiment includes a phase discriminator that samples the output of the oscillator and accumulates data representing the duty cycle of that signal. The duty cycle can then be combined with the average period of the test signal to determine, separately, the delays associated with falling and rising edges propagating through the test circuit. The worst-case delay associated with the test circuit can then be expressed as the longer of the two. Knowing the precise worst-case delay allows IC manufacturers to minimize the guard band and consequently guarantee higher speed performance.

In order to determine the durations of the high and low levels of the test signal, a sample clock signal is provided to count in separate counters the sample clock cycles that occur in the high and low portions of the test clock signal oscillating through the test circuit. If the test clock signal is phase locked with the sample-clock signal, the duty cycle calculated by counters that measure high and low parts of the signal may be incorrect. To overcome this problem, the sample clock signal is phase shifted periodically, preferably in a random or pseudo-random manner.

DETAILED DESCRIPTION

Figure 2:
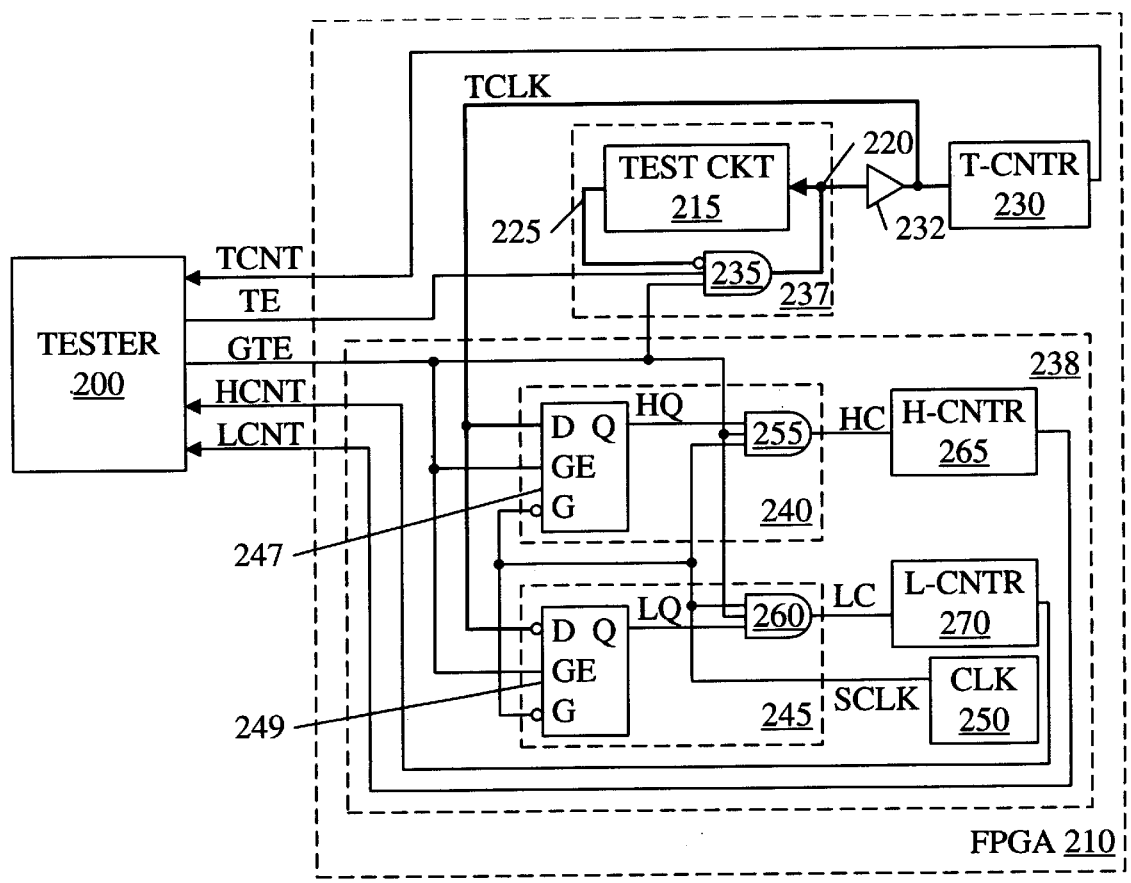
FIG. 2 is a schematic diagram of a conventional tester 200 connected to an FPGA 210 configured to include test circuitry in accordance with the present invention.

FIG. 2 is a schematic diagram of a conventional tester 200 connected to an FPGA 210 that has been configured to implement an oscillator and to determine the period and the high and low duty cycles of the oscillator. The purpose of the depicted configuration is to determine the propagation delay for signals traversing test circuit 215 from an input node 220 through an output node 225 and back to input node 220. Test circuit 215 might be any signal path for which the signal propagation delay is of interest. Test circuit 215 is configured to form a path through elements of FPGA 210 for which delay is to be measured. The invention allows a user to separately measure the propagation delays associated with the rising and falling edges of logic signals.

Input node 220 of test circuit 215 is connected to a test counter 230 via a buffer 232, and is driven by the output terminal of an AND gate 235. Output node 225 of test circuit 215 is connected back to input node 220 via an inverting input terminal of AND gate 235. The remaining input terminals of AND gate 235 are connected to a test-enable line TE and a global test-enable line GTE, both from tester 200.

Test counter 230 is a conventional counter connected via a test-count line (or lines) TCNT to tester 200. A reset line (not shown) connected between tester 200 and test counter 230 allows tester 200 to reset test counter 230 to zero.

Global test-enable line GTE conveys a global test-enable signal to any number of test circuits on FPGA 210; test-enable TE is specific to test circuit 215. The use of two test-enable lines allows a number of different test circuits to share test circuitry. For example, the test clock signals TCLK from a number of test circuits can be logically ORed and the result input to test counter 230. Counter 230 would then only accumulate data for the active one of the test circuits. Similarly, the HC/LC signals from a number of test circuits can be logically ORed and the result input to HENTR 265. The phase discriminators 240 and 245 would be duplicated, one for each test circuit 215. Actually, if only one test circuit 215 is to be tested, it is not necessary to provide both test enable lines.

The logic levels on at least one of test-enable lines GTE and TE are low (e.g., zero volts) when test circuit 215 is not under test. Thus, AND gate 235 outputs a steady logic zero, as does test circuit 215, and counter 230 does not count. (As shown, test circuit 215 is non-inverting. However, in another embodiment, test circuit 215 is inverting and the bubble on AND gate 235 is eliminated.)

Tester 200 initiates a test cycle to determine the propagation delay of test circuit 215 by bringing test-enable lines GTE and TE to logic ones (e.g., 3.3 volts). AND gate 235 then acts as a simple inverter between nodes 225 and 220 for as long as test-enable lines GTE and TE remain high. Consequently, test circuit 215 and AND gate 235 become a ring oscillator 237 whose frequency depends, primarily, on the signal-propagation delay of test circuit 215.

Test counter 230 is configured to increment for each rising edge of the test clock signal TCLK. Thus, after test-enable lines GTE and TE are both asserted (brought to a logic one) for a selected time period, test counter 230 will contain the number of oscillation periods that oscillator 237 generated over that time period. This number is fed to tester 200 on test-count line (or lines) TCNT. Calculating the period of oscillator 237 is then a simple matter of dividing the total time period that the test-enable lines GTE and TE were asserted by the number of counts stored in test counter 230. For example, if test-enable lines GTE and TE were held high for one second and achieve a count of 1000, then the oscillation period of oscillator 237 is one second divided by 1000, or 1 millisecond. The delay associated with test circuit 215 is approximately one half of this oscillation period, or 0.5 milliseconds.

Alternatively, test counter 230 can be configured to decrement from a maximum count, and calculations can be based on the final decremented count. Or, instead of having a fixed test time, a counter can count (up or down) a specified number of counts, at which time it reports to the tester, which determines how long the test took to run.

Figure 1:
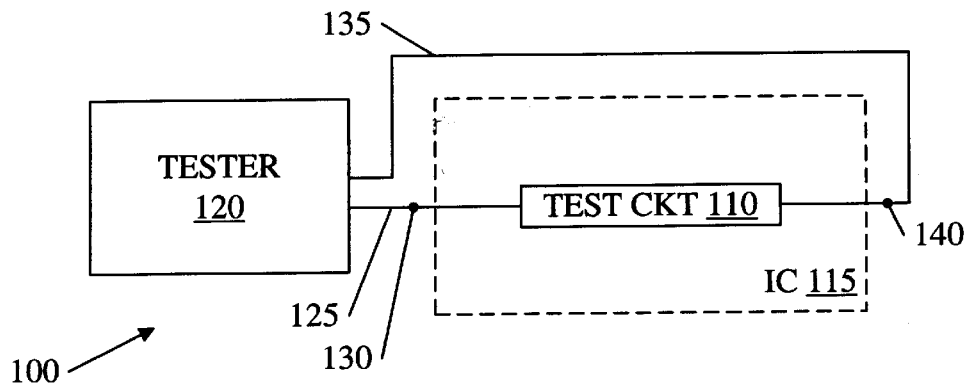
FIG. 1 depicts a conventional test configuration 100 for determining the signal propagation delay of a test circuit 110 in a conventional IC 115.

As compared to the conventional system of FIG. 1 which measures time delay over one pass through the circuit, using oscillator 237 to calculate the delay of test circuit 215 is more accurate because the delay is accumulated over many cycles. Moreover, the method is less expensive to implement in FPGAs because the FPGA can be configured to simultaneously include many test circuits and the test circuitry (e.g., oscillator 237 and test counter 230) required to characterize them.

Employing test circuit 215 as part of an oscillator is a simple and inexpensive way to measure the delay associated with test circuit 215. However, this method gives an average signal propagation delay for falling and rising edges. In practice, signal paths often exhibit different propagation delays for falling and rising edges, due to unbalanced driver circuits, for example. The trouble with providing average propagation delays is that the worst-case delay is greater than the average. Consider, for example, the case where a signal path delays falling edges by 2 nanoseconds and rising edges by 3 nanoseconds. The average, 2.5 nanoseconds, is shorter than the worst-case delay associated with rising edges. In fact, the only case in which the average delay is precisely indicative of the worst case is when the delays associated with rising and falling edges are identical. Thus, a conservative guard band must be added to the average delay to ensure an IC performs as advertised.

Adding conservative guard bands to average propagation delays is adequate for some applications. However, IC manufacturers can guarantee higher speed performance if they can further reduce the guard band by providing more accurate delay data. To this end, FPGA 210 is configured to include a phase discriminator 238 that samples the signal on test-clock line TCLK and accumulates data representing the duty cycle of that signal. The test duty cycle can then be combined with the average period to determine, separately, the delays associated with falling and rising edges propagating through test circuit 215. The worst-case delay associated with test circuit 215 can then be expressed as the longer of the two.

Knowing the precise worst-case delay allows IC manufacturers to minimize the guard band and consequently guarantee higher speed performance. In addition, knowing which type of signal transition propagates more slowly allows IC designers to optimize signal paths more efficiently by focusing on those components responsible for the slower performance.

Phase discriminator 238 includes a pair of phase comparators 240 and 245. Phase comparators 240 and 245 include respective latches 247 and 249, each of which has a gate-enable terminal GE connected to global test-enable line GTE, a D input terminal connected to the output terminal of buffer 232 at the input of test circuit 215, and a gate terminal G connected to sample-clock line SCLK from a sample clock 250. (Buffer 232 isolates the measurement circuitry, including counter 230 and latches 247 and 249, from the circuit 215 under test.) In one embodiment, sample clock 250 is a conventional free-running oscillator, such as a ring oscillator. Sample clock 250 may have an oscillation frequency that is either greater than or less than that of oscillator 237 as long as sample clock 250 has a period short enough that many cycles are counted during the test period. One latch 249 is configured to produce a high output signal when its input signal is low, and the other latch 247 is configured to produce a high output signal when its input signal is high. Latches 247, and 249 should be designed so that they do not oscillate in a metastable state because any such oscillations can introduce significant measurement errors.

Phase comparators 240 and 245 also include a pair of three-input AND gates 255 and 260. AND gate 255 includes an output terminal HC connected to an input terminal of a conventional counter 265; similarly, AND gate 260 includes an output terminal LC connected to an input terminal of a conventional counter 270. Each of counters 265 and 270 includes an output line (or lines) connected to tester 200. Output lines HCNT and LCNT convey the respective contents of counters 265 and 270 to tester 200. A reset line (not shown) from tester 200 to each of counters 265 and 270 zeros each counter when asserted by tester 200. Latches 240 and 245 are inactive while global test-enable line GTE is not asserted.

Counters 265 and 270 and sample clock 250 can be shared by a number of different test circuits. For example, the high-counts signal HC from a number of test circuits can be logically ORed and the result input to counter 265. Likewise, the low-counts signal LC from a number of test circuits can be logically ORed and the result input to counter 270. Counters 265 and 270 would then only accumulate data for the active one of the test circuits. In one embodiment, each of counters 230, 265, and 270 and sample clock 250 are shared by 32 individual test oscillators 237.

Figure 2A:
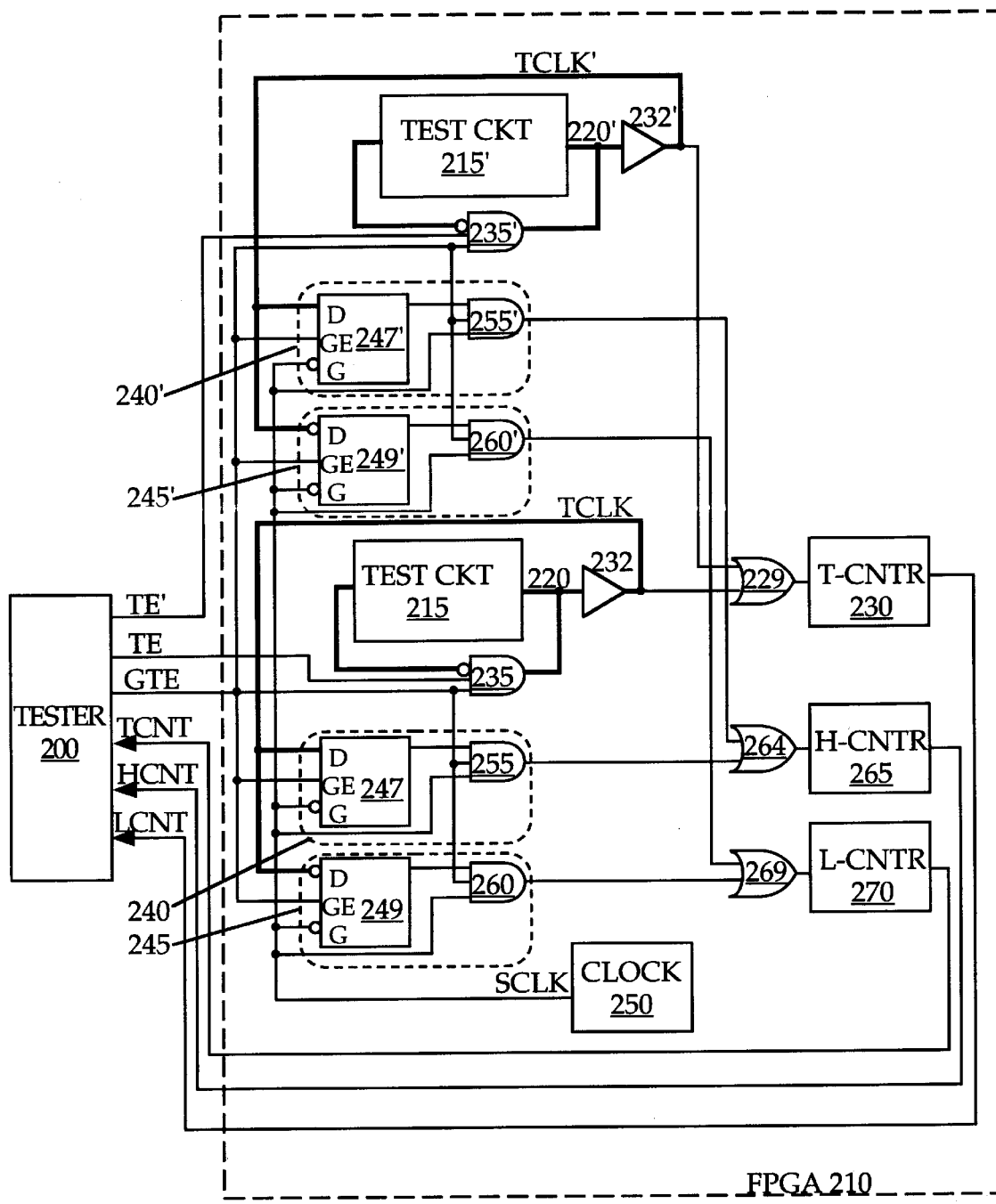
FIG. 2A is a schematic diagram of an embodiment similar to that of FIG. 2 but including two test circuits.

FIG. 2A shows an embodiment of the invention in which two test circuits 215 and 215' are tested using the same clock 250 and same counters 230, 265, and 270 for testing both test circuits. OR gates 229, 264, and 269 combine the signals from the two test circuits 215 and 215'. At any one time, only one of the buffers 232 and 232' is providing a non-zero output signal as determined by test enable signals TE and TE' from tester 200. Likewise, only one of AND gates 255 and 255' is providing a non-zero signal to OR gate 264 and only one of AND gates 260 and 260' is providing a non-zero signal to OR gate 269. Thus, counters 230, 265, and 270 provide counts for the selected one of circuits 215 and 215'. Any number of test circuits such as 215 can be simultaneously formed in a programmable device such as an FPGA. The test circuits are tested one at a time.

Figure 3:
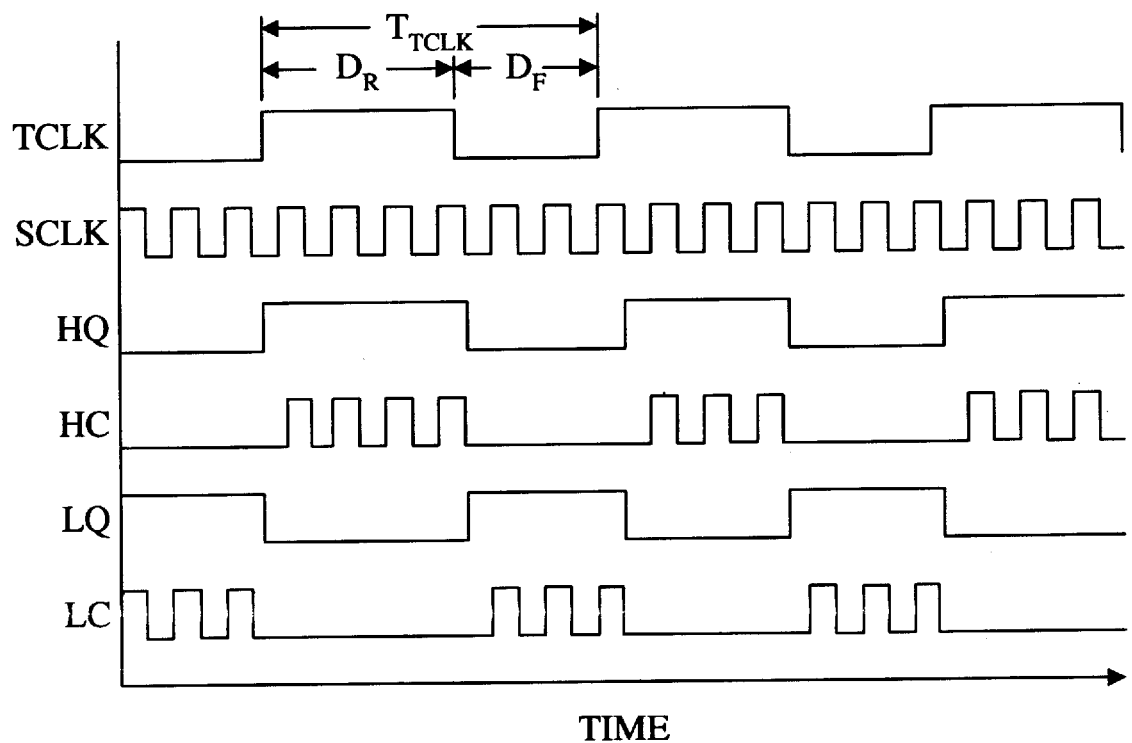
FIG. 3 is a simple waveform diagram depicting the operation of tester 200 and FPGA 210 of FIG. 2.

FIG. 3 is a simple waveform diagram depicting the operation of tester 200 and FPGA 210 of FIG. 2. Each waveform in FIG. 3 is labeled using the corresponding node designation depicted in FIG. 2. The node designations are hereafter used to alternatively refer to circuit nodes or their corresponding signals. In each instance, the interpretation of the node designations as either signals or physical elements will be clear from the context.

For illustrative purposes, test clock signal TCLK is shown to have a duty cycle of approximately 60% (i.e., test clock signal TCLK is high for approximately 60% of the total test-clock period $T_{TCLK}$). If the delays imposed by test circuit 215 were identical for both falling and rising edges, the duty cycle would be 50%. The illustrative 60% duty cycle exemplifies the case in which the delay $D_R$ associated with rising edges is longer than the delay $D_F$ associated with falling edges on node 220.

While the frequency of sample clock SCLK is higher than the frequency of test clock signal TCLK in the present example, this is not required. The frequency of sample-clock signal SCLK can be higher or lower than that of test clock signal TCLK. The only restriction is that sampling should occur for many cycles of both TCLK and SCLK. Also, sample clock 250, and counters 230, 265, and 270 can be provided from a source external to FPGA 210, such as from tester 200, for example. Discriminator circuits 240 and 245 must be on FPGA 210 if results are to be reliable. Implementing the test circuitry 215 and discriminators 240 and 245 on FPGA 210 is simple and inexpensive, and allows a user to minimize the loading effect of test-signal paths that contribute to the load on oscillator 237 by making these paths as short as possible. These paths are depicted with bold lines in FIG. 2.

As discussed above, tester 200 outputs a logic one on global test-enable line GTE for a known duration. This logic one enables latches 240 and 245 to respond to clock signal SCLK, and allows AND gates 255 and 260 to logically combine the signals on their remaining input terminals. FIG. 3 depicts the operation of FPGA 210 and tester 200 with the signal on global test-enable line GTE asserted.

Latch 247 transfers the logic level on its D input to line HQ on each falling edge of sample clock SCLK, thus producing the signal HQ. AND gate 255 logically combines signal HQ with sample clock signal SCLK to produce the signal HC (HC stands for "high counts"). Counter 265 counts the pulses of signal HC to accumulate a count proportional to the time during which global test-enable signal GTE is asserted and test clock signal TCLK is high. In the example provided, counter 265 would accumulate a count of ten, representing the ten pulses of HC, during the depicted time period (i.e., three periods of test clock signal TCLK).

Latch 249 transfers the inverted logic level on its D input to line LQ on each falling edge of sample-clock signal SCLK, thus producing the signal LQ. AND gate 260 logically combines signal LQ with sample-clock signal SCLK to produce the signal LC (LC stands for "low counts"). Counter 270 counts the pulses of signal LC to accumulate a count proportional to the time during which test-enable signal TE is asserted and test clock signal TCLK is low. In the example provided, counter 270 would accumulate a count of nine, representing the nine pulses of LC, during the depicted time period.

Counters 265 and 270 contain all the information required to determine the duty cycle $DC_{TCLK}$ of test clock signal TCLK. The calculation is as follows:

$$DC_{TCLK} = \{HCNT/(HCNT+LCNT)\} \times 100\% \quad (1)$$

where HCNT is the count stored in counter 265 when global test-enable line GTE is released (i.e., de-asserted) and LCNT is the count stored in counter 270 when global test-enable line GTE is released.

In the foregoing example, the duty cycle $DC_{TCLK}$ of the test clock signal TCLK would be $10/(10+9) \times 100\% = 53\%$. From FIG. 3 it can be seen that the duty cycle of test clock signal TCLK is somewhat higher than 53%; however, test clock signal TCLK was only sampled for three periods for ease of illustration. In practice, test clock signal TCLK might have a period $T_{TCLK}$ of, for example, 100 nanoseconds. Thus, a one-second test cycle would allow the counts in counters 265 and 270 to accumulate over one second divided by 100 nanoseconds/$T_{TCLK}$, or ten million periods of test clock signal TCLK. This large sample size would provide a much more accurate measure of the actual duty cycle $DC_{TCLK}$ of test clock signal TCLK.

The worst-case signal delay through test circuit 215 can be calculated by recognizing that the longer of the delays associated with rising and falling edges is responsible for the longest time period separating signal transitions in test clock signal TCLK.

The rising-edge delay $D_R$ and the falling edge delay $D_F$ are calculated using variables HCNT, LCNT, and the test-clock period $T_{TCLK}$. As discussed above, calculating the period is a simple matter of dividing the total time period that the global test-enable line GTE is asserted by the number of counts stored in test counter 230. The rising-edge delay $D_R$ is then:

$$D_R = \{HCNT/(HCNT+LCNT)\} \times T_{TCLK} \quad (2)$$

The falling-edge delay $D_F$ is:

$$D_F = \{LCNT/(HCNT+LCNT)\} \times T_{TCLK} \quad (3)$$

The worst-case delay $D_{WC}$ of test clock signal TCLK is the greater of delays $D_R$ and $D_F$, or:

$$D_{WC} = MAX(D_R, D_F) \quad (4)$$

Oscillator 237 and associated test circuitry work well for asynchronous test circuits in which the output signal on line 225 transitions directly in response to rising and falling signals on input node 220. However, applicants discovered that including even one synchronous component in test circuit 215 can interrupt oscillator 237. Consequently, oscillator 237 could not be used to measure critical timing characteristics of synchronous components. One such characteristic is the time required for an output signal to appear on an output terminal after the synchronous component is clocked, or the "clock-to-out" delay. Applicants therefore discovered a need for an oscillator configuration that included synchronous components and that oscillated at a frequency indicative of critical delays associated with those synchronous components.

Figure 4:
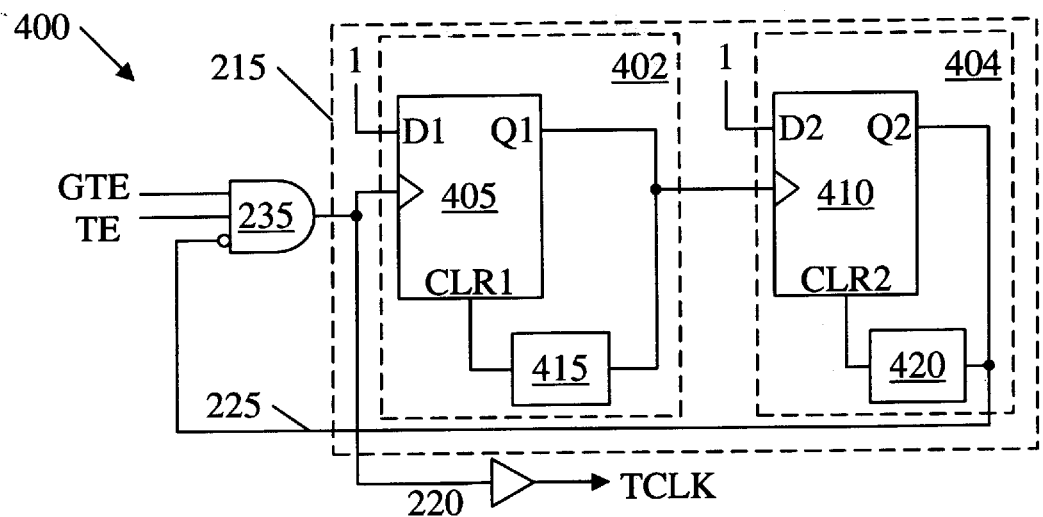
FIG. 4 is a simplified schematic diagram of an oscillator 400 that includes an embodiment of test circuit 215 configured in accordance with the present invention.

FIG. 4 is a simplified schematic diagram of an oscillator 400 that includes an embodiment of test circuit 215 configured in accordance with the present invention. Oscillator 400 includes an AND gate 235 and terminals 220 and 225, which are identical to the like-numbered elements of FIG. 2. Oscillator 400 also includes a pair of pulse generators 402 and 404, which include respective synchronous components, flip-flops 405 and 410. As described below in detail, oscillator 400 is configured to oscillate at a frequency that is dependent on the clock-to-out delays of flip-flops 405 and 410. The clock-to-out delays associated with flip-flops 405 and 410 can therefore be determined by measuring the frequency of oscillator 400 and the phase-high duty cycle. Once these delays are known, they can be used to create circuit models that accurately predict circuit timing for FPGA configurations that include flip-flops 405 and 410, or similar synchronous components.

Flip-flops 405 and 410 include respective clock terminals, conventionally designated using a ">" symbol. Flip-flops 405 and 410 also include synchronous "D" input terminals D1 and D2, asynchronous clear terminals CLR1 and CLR2, and "Q" output terminals Q1 and Q2. Synchronous input terminal D1 is connected to a logic one (e.g., 3.3 volts) so that flip-flop 405 outputs a logic one when a rising edge is presented on the clock terminal of flip-flop 405. Output terminal Q1 is connected to the clock terminal of flip-flop 410, and to asynchronous clear terminal CLR1 via a delay element 415. Flip-flop 410 is configured similarly, with synchronous input terminal D2 connected to a logic one, and output terminal Q2 connected to the inverting input of AND gate 235 and to asynchronous clear input CLR2 via a delay element 420.

Figure 5:
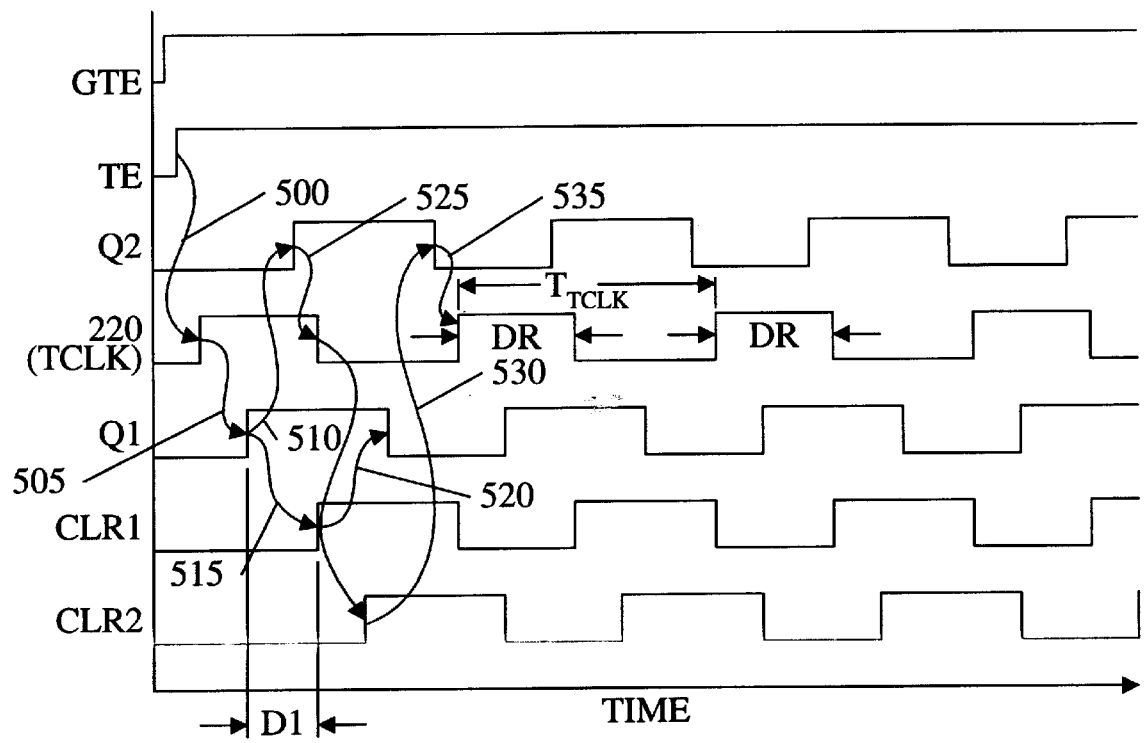
FIG. 5 is a simple waveform diagram depicting the operation of tester oscillator 400 of FIG. 4.

FIG. 5 is a simple waveform diagram depicting the operation of test oscillator 400 of FIG. 4. Each waveform in FIG. 5 is labeled using the corresponding terminal designation depicted in FIG. 4. The terminal designations are hereafter used to alternatively refer to terminals or their corresponding signals. In each instance, the interpretation of the terminal designations as either signals or physical elements will be clear from the context.

Tester 200 (FIG. 2) initiates testing of any number of test circuits such as 215 by asserting test-enable signal TE to the test circuit of interest. Tester 200 then enables test circuit 215 by asserting global test-enable signal GTE. With both test-enable signals GTE and TE asserted, AND gate 235 drives line 220 from a logic zero to a logic one (arrow 500). Flip-flop 405 responds to the rising edge of the signal on line 220 by providing output terminal Q1 with a logic one (arrow 505), the logic level on synchronous input terminal D1.

Raising output terminal Q1 to a logic one triggers two events. First, the rising edge clocks flip-flop 410 so that the logic one on input terminal D2 appears on output terminal Q2 (arrow 510). Second, raising the input level to delay element 415 to a logic one clears flip-flop 405 after the delay D1 imposed by delay element 415, thereby resetting output terminal Q1 to a logic zero (arrows 515 and 520). This second event prepares flip-flop 405 for a subsequent rising edge. Thus, pulse generator 402 creates a periodic signal Q1 in which the pulse duration is defined by delay element 415 and the time required to clear flip-flop 405.

Pulse generator 404 operates in much the same way as pulse generator 402. When clocked by the rising edge of the signal on output terminal Q1, flip-flop 410 outputs a logic one to the inverting input of AND gate 235 to return input node 220 to a logic zero (arrow 525). The entire process then begins anew when the logic one through delay element 420 clears flip-flop 410 (arrow 530), consequently returning signal Q2 to logic zero, which causes AND gate 235 to return signal 220 to a logic one (arrow 535).

Signal 220 remains a logic one until the rising edge on signal 220 propagates through flip-flops 405 and 410. The resultant rising edge from output terminal Q2, inverted by AND gate 235, returns signal 220 to a logic zero. The delay period $D_R$ between the rising and falling edges of signal 220 thus represents the rising-edge delay, or the time required for the rising edge on terminal 220 to propagate through flip-flops 405 and 410.

The rising-edge delay $D_R$ is measured using the buffered test clock signal TCLK (FIG. 2). The calculation is as discussed in FIG. 2, reproduced below:

$$D_R = HCNT/(HCNT+LCNT) \times T_{TCLK} \quad (5)$$

where HCNT and LCNT are the counts stored in respective counters 265 and 270 (FIG. 2A) and test-clock period $T_{TCLK}$ is obtained as described above in connection with FIGS. 2 and 3. An example of a test circuit including fifteen test elements is described below in connection with FIG. 7.

Figure 6:
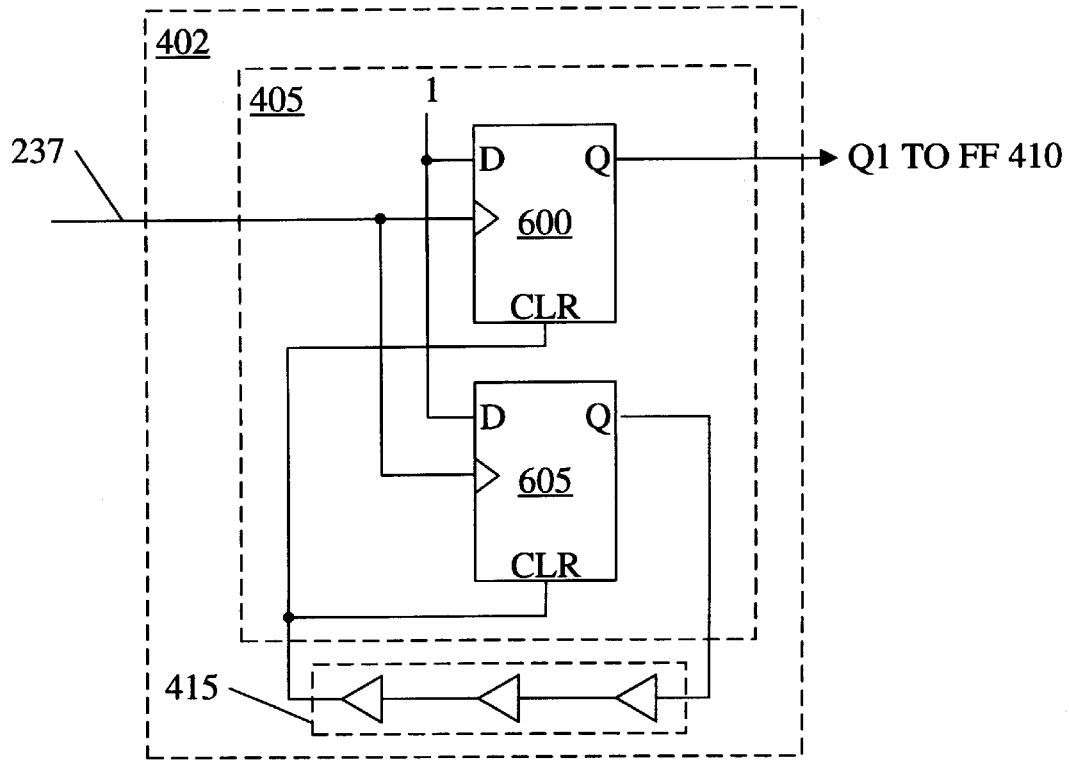
FIG. 6 is a more detailed schematic diagram of one embodiment of pulse generator 402, including flip-flop 405 and delay element 415.

FIG. 6 is a more detailed schematic diagram of one embodiment of pulse generator 402, including flip-flop 405 and delay element 415. Flip-flop 405 includes two conventional D flip-flops 600 and 605. Flip-flop 600 operates as described above in connection with FIGS. 4 and 5 to clock a subsequent flip-flop (e.g., flip-flop 410). Flip-flop 605, identical to flip-flop 600 in the depicted example, is added to minimize the loading effect of delay circuit 415 so that the clock-to-out timing of flip-flop 600 is accurately represented by the oscillation frequency of oscillator 400.

In one embodiment, delay circuit 415 includes three buffers connected in series. Delay circuit 415 introduces more delay than the clock-to-out delay of the associated flip-flop and less than the delay around the ring comprising flip-flop 405, flip-flop 410, and AND gate 235. This delay is selected to ensure that output terminal Q1 remains high long enough to clock the subsequent flip-flop 410. As different flip-flops have different set-up times, delay element 415 should be optimized for the particular application. In the embodiment of FIG. 6, the flip-flops and buffers are elements selected from among the available resources on the FPGA.

Figure 7:
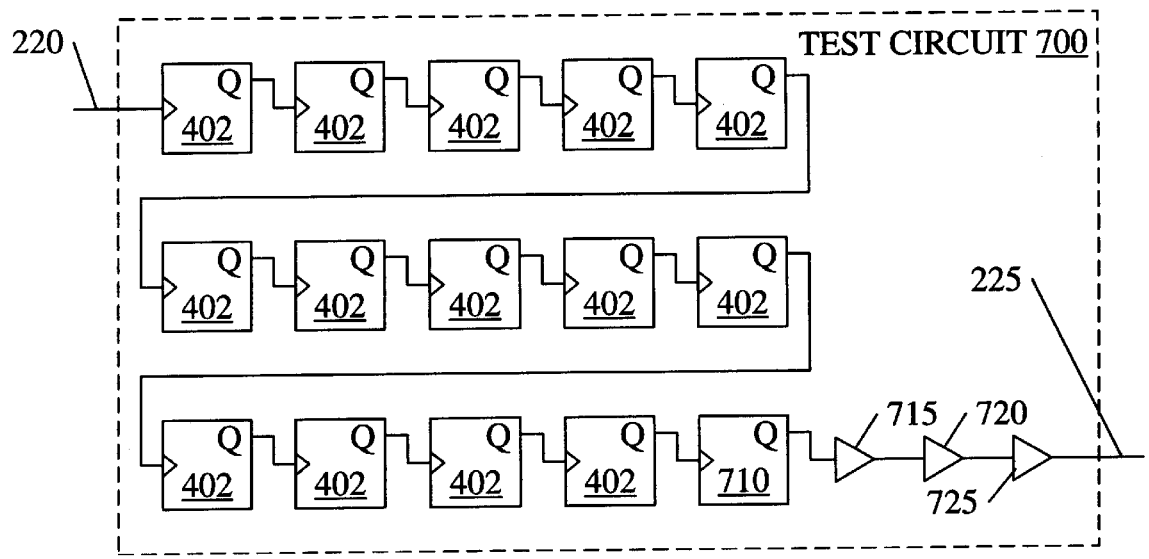
FIG. 7 is a simplified schematic diagram of a test circuit 700 that employs fifteen pulse generators to measure the clock-to-out delay associated with the flip-flops included in those pulse generators.

FIG. 7 is a simplified schematic diagram of a test circuit 700 that employs fifteen pulse generators to measure the clock-to-out delay associated with the flip-flops included in those pulse generators. Fourteen of the pulse generators are instantiations of pulse generator 402 programmed onto an FPGA in close proximity to one another. The last pulse generator in the series, pulse generator 710, has a higher associated load because the output is routed back through AND gate 235 to the first pulse generator 402 in the series. This load is depicted by a series of three buffers 715, 720, and 725 included to drive the relatively long signal path back through AND gate 235 to the first pulse generator. As a consequence of the increased load, the signal propagation delay from the output terminal of pulse generator 710 to the clock input of the first pulse generator 402 is relatively long. Pulse generator 710 is modified to account for this increased delay, as illustrated in FIG. 8.

Figure 8:
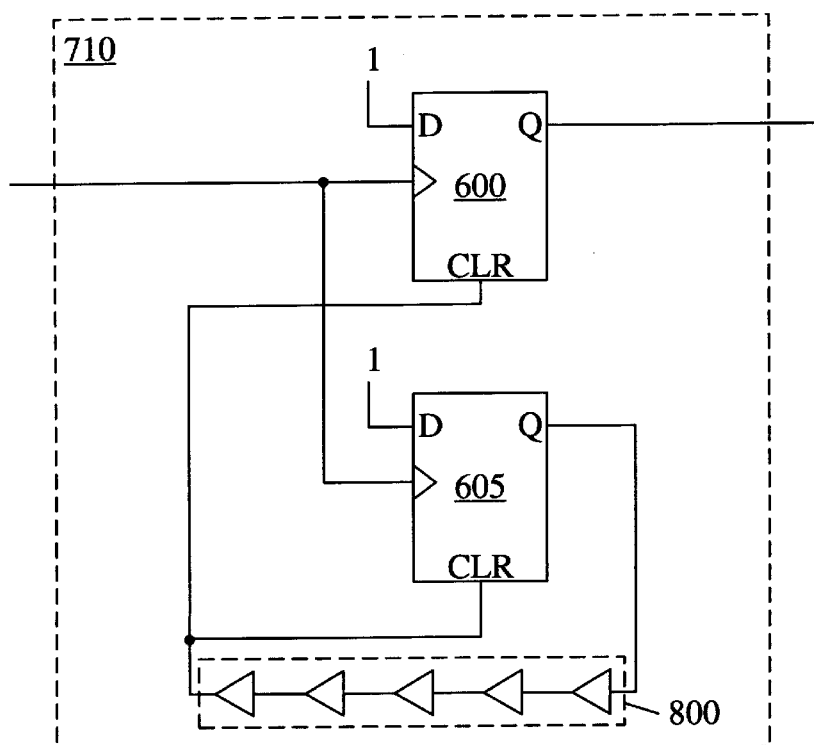
FIG. 8 is a detailed schematic diagram of pulse generator 710.

FIG. 8 is a schematic diagram of pulse generator 710. Pulse generator 710 includes a delay element 800 that exhibits a delay long enough to ensure that the output signal from pulse generator 710 has time to clock the first pulse generator 402 of test circuit 700 before flip-flop 600 is cleared. In the depicted embodiment, five buffers provide the requisite delay. The remaining circuitry is as described above in connection with pulse generator 402 of FIG. 4.

Referring back to FIG. 4, the signal propagation delay of test circuit 215 is only representative of the delay associated with rising edges because each of flip-flops 405 and 410 clocks on rising edges. It is also important to measure the delays associated with falling edges to determine worst-case delays because signal paths often exhibit different propagation delays for falling and rising edges.

Figure 9:
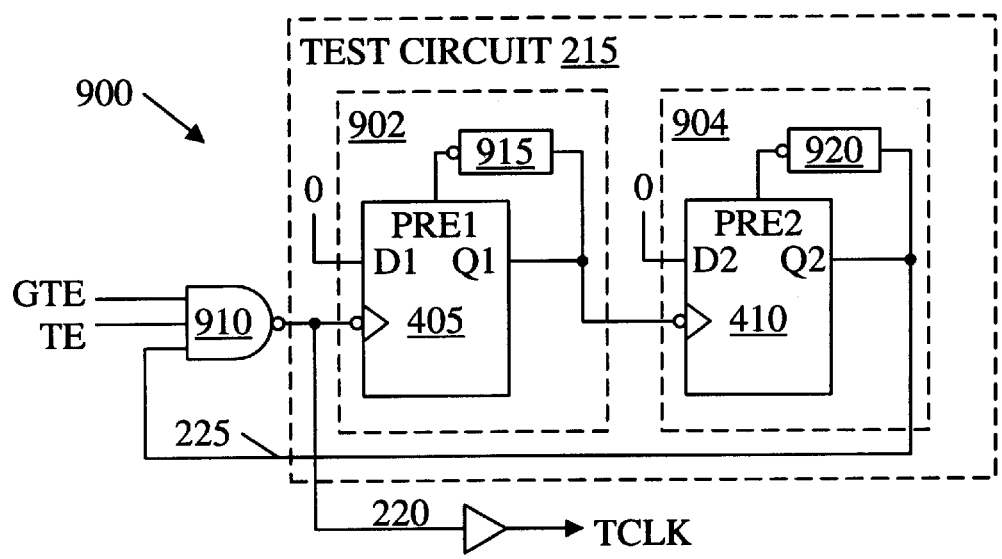
FIG. 9 depicts an oscillator 900 similar to oscillator 400 of FIG. 4 but configured to measure the clock-to-out delay associated with falling-edge clock signals.

FIG. 9 depicts an oscillator 900 similar to oscillator 400 of FIG. 4 but configured to measure the clock-to-out delay associated with falling-edge clock signals. Oscillator 900 includes flip-flops 405 and 410, which are identical to the like-numbered elements of FIG. 4; the remaining circuitry and input signals are adapted so that flip-flops 405 and 410 are clocked by falling edges and are shortly thereafter preset so that their respective Q outputs are set to logic ones.

Oscillator 900 also includes a NAND gate 910 in place of AND gate 235 of FIG. 4. The respective D input terminals of flip-flops 405 and 410 are connected to logic zeros and the respective clock input terminals are inverting. Flip-flop 405 includes an associated inverting delay element 915 between output terminal Q1 and a preset terminal PRE1. Flip-flop 410 is similarly configured with an inverting delay element 920 connected between output terminal Q2 and preset terminal PRE2.

The logic-zero portions of signal 220 are used to measure the falling-edge delay $D_F$. Falling-edge delay $D_F$ is calculated as:

$$D_F = LCNT/(HCNT+LCNT) \times T_{TCLK} \quad (6)$$

where HCNT and LCNT are the counts stored in respective counters 265 and 270 of FIG. 2 and $T_{TCLK}$ is the period of test clock signal TCLK. Thus, the sequential worst case delay $D_{SWC}$ is $$D_{SWC} = MAX\ (eq.\ 5,\ eq.\ 6) \quad (7)$$

The operation of oscillator 900 is similar to oscillator 400 of FIG. 4; a detailed discussion of the operation of oscillator 900 is therefore omitted for brevity.

In the example of FIG. 3 discussed earlier, the worst-case delay is $D_R$ associated with rising edges. In addition to knowing the worst-case delay, a circuit designer may wish to know the precise delays associated with rising and falling edges. The falling-edge delay $D_F$ is equal to $\{LCNT/(HCNT+LCNT)\} \times T_{TCLK}$; the rising-edge delay $D_R$ is equal to $\{HCNT/(HCNT+LCNT)\} \times T_{TCLK}$.

Figure 10:
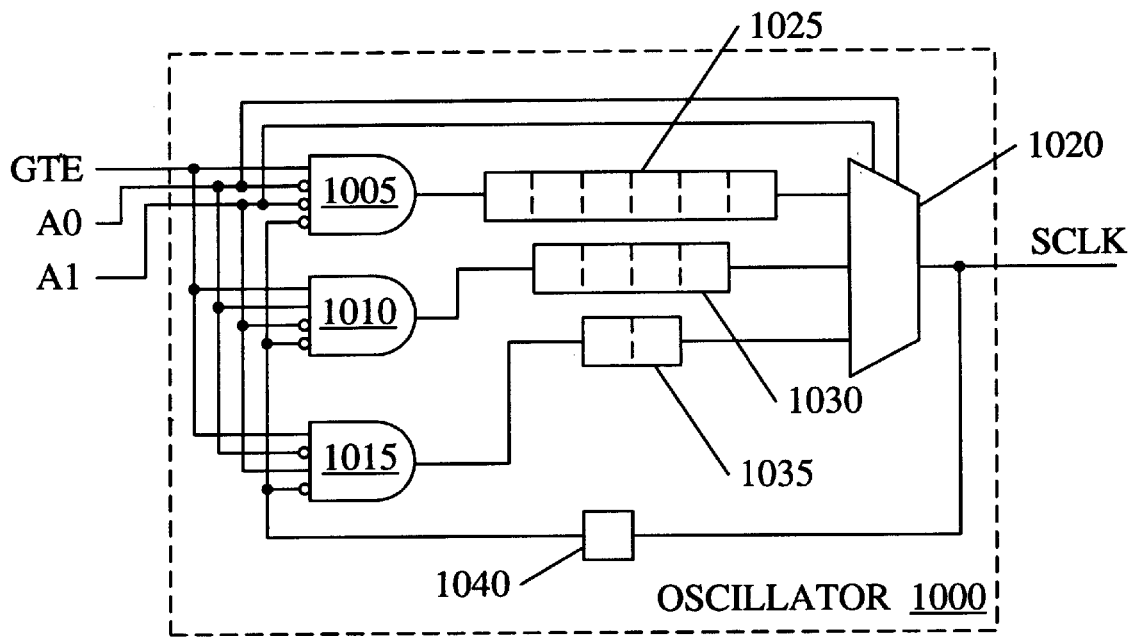
FIG. 10 depicts a special oscillator 1000 that may be used in place of clock 250 of FIG. 2.

If the test clock signal TCLK is phase locked with the sample-clock signal SCLK, the duty cycle calculated by phase discriminator 238 may be incorrect. FIG. 10 depicts a special oscillator 1000 that may be used in place of clock 250 of FIG. 2 to overcome this problem.

Oscillator 1000 is actually three oscillators in one, each of which has a frequency that is prime with respect to the other two. The duty cycle $DC_{TCLK}$ of oscillator 237 is simply tested at three different frequencies and the results are compared. If all three results are the same, one can be assured that the measured duty cycle is correct. If, on the other hand, one measurement disagrees with the remaining two, that measurement is thrown out in favor of the others. The likelihood that the two agreeing measurements are in error is exceedingly low, particularly because the oscillation frequencies are prime with respect to one another.

Oscillator 1000 includes three AND gates 1005, 1010, and 1015 connected to a multiplexer 1020 via respective delay elements 1025, 1030, and 1035. The output terminal of multiplexer 1020, which serves as the output terminal of oscillator 1000, provides the sample-clock signal SCLK described above in connection with FIGS. 2 and 3. Sample-clock signal SCLK is fed back to one input terminal of each of AND gates 1005, 1010, and 1015 via a fourth delay element 1040. Each of delay elements 1025, 1030, 1035, and 1040 is shown as segmented to illustrate the respective amounts of delay associated with each delay element. For example, delay element 1025, illustrated as six segments, has an associated delay period that is three times greater than the two-segment delay element 1035. In this example, each segment of delay elements 1025, 1030, 1035 represents a single conventional buffer circuit that imposes for example 5 nanoseconds of delay and delay element 1040 imposes a delay of 50 nanoseconds.

Tester 200 turns oscillator 1000 on by asserting global test-enable signal GTE. Two additional input terminals A0 and A1 from tester 200 select from among delay elements 1025, 1030, and 1035 to establish desired clock frequencies on sample-clock terminal SCLK. Logic zeroes on input terminals A0 and A1 allow AND gate 1005 to pass sample clock signals from delay element 1040 through delay element 1025 to be selected and output by multiplexer 1020. The period of the sample clock signal on sample-clock line SCLK will then be approximately twice the cumulative delay imposed by delay elements 1025 and 1040. In the above example, the cumulative delay will be 80 nanoseconds. A logic one on input terminal A0 combined with a logic zero on input terminal A1 combine delay elements 1030 and 1040 to provide a shorter cumulative delay (e.g., 70 nanoseconds), and a logic zero on input terminal A0 combined with a logic one on input terminal A1 combines delay elements 1035 and 1040 to provide a still shorter cumulative delay of some 60 nanoseconds. The combined delays are intentionally selected to be prime with respect to one another to ensure that at least two resulting sample-clock frequencies will not be phase locked with the test clock signal TCLK. AND gates 1005, 1010, and 1015 have been included so that delay elements not being used will not cycle and generate heat. However, in another embodiment, AND gates 1005, 1010, and 1015 are eliminated from the circuit, and selection of the path is simply controlled by signals A0 and A1 to multiplexer 1020.

Figure 11:
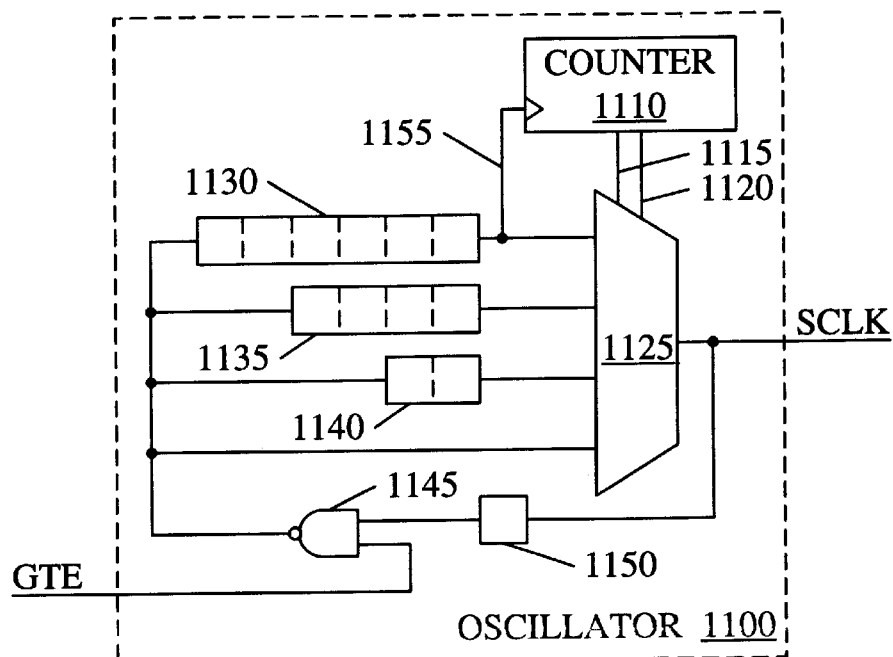
FIG. 11 is a schematic diagram of an oscillator 1100 that, like oscillator 1000, may be used in place of clock 250 of FIG. 2.

FIG. 11 is a schematic diagram of an oscillator 1100 that, like oscillator 1000, may be used in place of sample clock 250 of FIG. 2 to avoid the problems associated with the sample clock signal on sample-clock line SCLK being phase locked with the test clock signal TCLK. Oscillator 1100 has four distinct oscillation frequencies. A conventional two-bit counter 1110 selects from among these frequencies by providing a pair of select signals on select lines 1115 and 1120 to a multiplexer 1125. These select signals select an output signal of one of three delay elements 1130, 1135, and 1140 or directly from an output terminal of a NAND gate 1145. The oscillation frequency of oscillator 1100 is then dictated by the total delay imposed by the selected delay element, if any, and a fourth delay element 1150.

Each of delay elements 1130, 1135, and 1140 is depicted as segmented to illustrate the respective amounts of delay associated with each delay element. For example, delay element 1130, illustrated as six segments, has an associated delay period that is three times greater than that of delay element 1140. Delay element 1150 must have a delay that is larger than the largest delay of elements 1130, 1135, and 1140 plus other delays in the loop plus a safety factor. In one embodiment, two delay elements have delays quite close to each other and a third (and perhaps a fourth) have delays significantly different from the first two.

A logic one on global test-enable line GTE causes NAND gate 1145 to act as an inverter, completing an inverting feedback loop that causes oscillator 1100 to oscillate. An output line 1155 of the longest delay element 1130 connects to a clock input of counter 1100; consequently, counter 1100 increments on each rising edge of the signal on line 1155. Further, each time counter 1100 increments the frequency of oscillator 1100 changes. Thus, the frequency of the sample-clock signal SCLK periodically changes, greatly reducing the likelihood that the sample-clock signal SCLK will be phase locked with the test clock signal TCLK for an appreciable time period. Even better results can be obtained by selecting from among a greater number of oscillation frequencies, but this improvement comes at a cost of greater circuit complexity.

Figure 12:
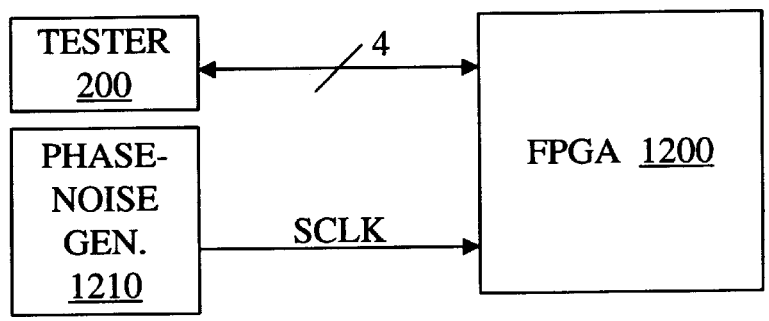
FIG. 12 is a block diagram of tester 200 of FIG. 2 and a noise generator 1210 each connected to an FPGA 1200 configured in accordance with the present invention.

FIG. 12 is a block diagram of tester 200 of FIG. 2 connected to an FPGA 1200 configured in accordance with the present invention. FPGA 1200 is identical to FPGA 210 of FIG. 2, except that sample clock 250 is either absent or inactive. Instead of sample clock 250, the system of FIG. 12 includes a phase-noise generator 1210 having an output terminal connected to the sample-clock line SCLK. Phase-noise generator 1210 is adapted to provide a signal that shifts phase, is compatible with the logic levels used by FPGA 215, and produces pulses of sufficient width to ensure the proper function of phase discriminator 238. This configuration provides for random sampling of test clock signal TCLK, thus avoiding the potential problems of a phase lock between the signals on sample-clock line SCLK and test-clock line TCLK.

The solution provided by phase-noise generator 1210 works well. It is preferable, however, to implement phase-noise generator 1210 using available FPGA resources to avoid the cost and complexity of using an external device.

Figure 13:
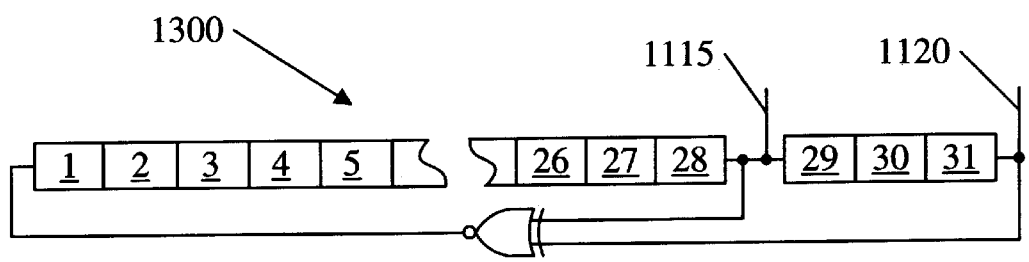
FIG. 13 is a schematic diagram depicting a conventional 31-bit linear-feedback shift register (LFSR) 1300 configured to generate a pseudo-random sequence of binary ones and zeros.

FIG. 13 is a schematic diagram depicting a 31-bit linear-feedback shift register (LFSR) 1300 configured in the FPGA to generate a pseudo-random sequence of binary ones and zeros. A 31-bit LFSR fits conveniently into a small portion of an FPGA, and generates a pseudo-random count. Any length that provides a random-looking output over the period of interest is acceptable. In one embodiment, LFSR 1300 replaces counter 1110 (FIG. 11) to control the select inputs 1115 and 1120 of multiplexer 1125. Thus, instead of clocking sequentially through a number of available delay periods, LFSR 1300 randomly selects from among the various delay elements. This further reduces the undesirable possibility of the sample-clock signal SCLK phase locking with test clock signal TCLK.

LFSRs are well known circuits. For a detailed discussion of an implementation of a 31-bit LFSR suitable for use with the present invention, see the Application Note from Xilinx, Inc., entitled "Efficient Shift Registers, LFSR Counters, and Long Pseudo-Random Sequence Generators," by Peter Alfke (Jul. 7, 1996), which is incorporated herein by reference.

While the present invention has been described in connection with specific embodiments, variations of these embodiments will be obvious to those of ordinary skill in the art. For example, any pseudo-random sequencer may be used in place of counter 1110. Another type of phase comparator may be used in place of comparators 240 and 245.

The embodiment of FIG. 2 provides an accurate measure of the test-clock duty cycle by sampling both high and low logic levels of test clock TCLK. The test-clock duty cycle could also be measured using only one of counters 265 or 270. Another embodiment determines the duty cycle using a counter connected to the sample clock to compare the number of sample counts over a given time period to the number of high and/or low counts over the same period.

Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A system for determining a maximum signal propagation delay through a test circuit having a test-circuit input node and a test-circuit output node, the system comprising:
   a. an inverting element having an inverting-element input node connected to the test-circuit output node and an inverting-element output node connected to the test-circuit input node, wherein the inverting element and the test circuit combine to form a ring oscillator providing a test signal comprised of alternating rising and falling signal transitions;
   b. a counter having a counter input node and at least one counter output node, the counter input node being connected to the test circuit, the counter adapted to count the number of signal transitions of the test signal; and
   c. a phase discriminator having at least one phase-discriminator input node connected to one of the test-circuit input and output nodes, the phase discriminator adapted to output a variable for calculating the duty cycle of the test signal.

2. The system of claim 1, wherein the phase discriminator includes a sample clock sequentially producing alternating rising and falling signal transitions on a sample-clock node.

3. The system of claim 2, wherein the sample clock is adapted to produce a plurality of sample-clock frequencies.

4. The system of claim 3, wherein the plurality of sample-clock frequencies are prime with respect to one another.

5. The system of claim 2, wherein the sample clock is a phase noise-generator.

6. The system of claim 2, wherein the sample clock is controlled by a shift register.

7. The system of claim 6, wherein the sample clock is controlled by a linear-feedback shift register.

8. The system of claim 1, wherein the test circuit is configured in an FPGA configured to include the counter and the phase discriminator.

9. The system of claim 2, the phase discriminator having a second phase-discriminator input node connected to the sample-clock node, and a test-circuit output node, wherein the phase discriminator samples the test signal between rising and falling signal transitions of the test signal at a sample rate determined by the sample clock.

10. The system of claim 9, wherein the test signal is sampled when the test signal is a logic zero.

11. The system of claim 9, wherein the test signal is sampled when the test signal is a logic one.

12. The system of claim 2, wherein the sample-clock node connects to a clock input of the phase discriminator.

13. A system for determining a maximum signal propagation delay through a test circuit having a test-circuit input node and a test-circuit output node. the system comprising:
   a. an inverting element having an inverting-element input node connected to the test-circuit output node and an inverting-element output node connected to the test-circuit input node, wherein the inverting element and the test circuit combine to form a ring oscillator providing a test signal comprised of alternating rising and falling signal transitions on the test-circuit input node;
   b. a counter having a counter input node and a counter output node, the counter input node being connected to the test circuit, the counter adapted to count the number of signal transitions of the test signal; and
   c. a phase discriminator having:
      i. a sample clock sequentially producing alternating rising and falling signal transitions on a sample-clock node;
      ii. a second phase-discriminator input node connected to the sample-clock node;
      iii. a phase-discriminator output node;
      iv. first and second phase comparators, each phase comparator having a first input node connected to the test circuit and adapted to receive the test signal, a second input connected to the sample-clock node, and a phase-comparator output node, wherein the first phase comparator samples the test signal between rising and falling signal transitions of the test signal at a sample rate determined by the sample clock when the test signal is a logic one, and the second phase comparator samples the test signal between rising and falling signal transitions of the test signal at a sample rate determined by the sample clock when the test signal is a logic zero;

d. wherein the phase discriminator produces a variable for calculating the duty cycle of the test signal.

14. A system for determining a maximum signal propagation delay through a test circuit having a test-circuit input node and a test-circuit output node, the system comprising:
   a. an inverting element having an inverting-element input node connected to the test-circuit output node and an inverting-element output node connected to the test-circuit input node, wherein the inverting element and the test circuit combine to form a ring oscillator providing a test signal comprised of alternating rising and falling signal transitions on the test-circuit input node;
   b. a counter having a counter input node and a counter output node, the counter input node being connected to the test circuit, the counter adapted to count the number of signal transitions of the test signal;
   c. a phase discriminator having:
      i. a sample clock sequentially producing alternating rising and falling signal transitions on a sample-clock node;
      ii. a second phase-discriminator input node connected to the sample-clock node; and
      iii. a phase-discriminator output node; and
   d. a counter having an input node connected to the phase-discriminator output node;
   e. wherein the phase discriminator samples the test signal between rising and falling signal transitions of the test signal at a sample rate determined by the sample clock; and
   f. wherein the phase discriminator produces a variable for calculating the duty cycle of the test signal.

15. The system of claim 13, further comprising a first counter having an input node connected to the output node of the first phase comparator and a second counter having an input node connected to the output node of the second phase comparator.

16. A method of measuring a signal propagation delay time required for a rising signal transition to traverse a test circuit having a test-circuit input node and a test-circuit output node, the method comprising:
   a. providing a train of alternating rising and falling signal transitions on the test-circuit input node, thereby producing a test signal comprising the alternating rising and falling signal transitions on the test-circuit output node;
   b. measuring the period of the test signal; and
   c. measuring the duty cycle of the test signal.

17. The method of claim 16, wherein measuring the period of the test signal comprises counting a number of test-signal periods over a predetermined time.

18. The method of claim 16, further comprising independently deriving, from the duty cycle and the period, a first signal propagation delay for rising edges traversing the test circuit and a second signal propagation delay for falling edges traversing the test circuit.

19. The method of claim 16, wherein the test signal comprises a series of alternating high and low logic levels, and wherein measuring the duty cycle of the test signal comprises sampling the test signal during the high and low logic levels at random sampling intervals.

20. The method of claim 19, further comprising generating the random sampling intervals using a phase noise-generator.

21. A method of measuring a signal propagation delay time required for a rising signal transition to traverse a test circuit having a test-circuit input node and a test-circuit output node, the method comprising:
   a. providing a train of alternating rising and falling signal transitions on the test-circuit input node, thereby producing a test signal comprising the alternating rising and falling signal transitions on the test-circuit output node;
   b. measuring the period of the test signal; and
   c. measuring the duty cycle of the test signal;
   d. wherein the test signal comprises a series of alternating high and low logic levels, and wherein measuring the duty cycle of the test signal comprises: sampling the test signal during the high logic levels at a sample rate to determine a first variable; and sampling the test signal during the low logic levels at the sample rate to determine a second variable.

22. The method of claim 21, further comprising:
   a. sampling the test signal during the high logic levels at a second sample rate different from the first sample rate; and
   b. sampling the test signal during the low logic levels at the second sample rate.

23. The method of claim 22, further comprising:
   a. sampling the test signal during the high logic levels at a third sample rate different from the first and second sample rates;
   b. sampling the test signal during the low logic levels at the third sample rate;
   c. calculating the duty cycle for each of the first, second and third sample rates to obtain corresponding first, second, and third measured duty cycles; and
   d. comparing the first, second, and third measured duty cycles.

24. The method of claim 23, further comprising discarding any one of the first, second, and third duty cycles that is not consistent with the remaining two.

25. A circuit for measuring a signal-propagation delay time required for a rising signal transition to traverse a test circuit having a test-circuit input node and a test-circuit output node, the circuit comprising:
   a. means for providing a train of alternating rising and falling signal transitions on the test-circuit input node, thereby producing a test signal comprised of a delayed series of alternating rising and falling signal transitions on the test circuit output node;
   b. means for measuring the period of the test signal; and
   c. means for measuring the duty cycle of the test signal.

26. The circuit of claim 25, further comprising means for independently deriving, from the duty cycle and the period, a first signal propagation delay for rising edges traversing the test circuit and a second signal propagation delay for falling edges traversing the test circuit.

27. A system for determining a maximum signal propagation delay through a test circuit having a test-circuit input node and a test-circuit output node, the system comprising:
   a. a ring oscillator including the test circuit and adapted to connect the test-circuit input node to the test-circuit output node, the ring oscillator providing a test signal comprised of alternating rising and falling signal transitions on the test-circuit input node and on the test-circuit output node;
   b. means for measuring a duty cycle of the test signal;

c. means for measuring a period of the test signal; and d. means for independently deriving, from the duty cycle and the period, a first signal propagation delay for rising edges traversing the test circuit and a second signal propagation delay for falling edges traversing the test circuit.

28. The system of claim 27, wherein the means for measuring the duty cycle of the test signal includes at least one phase comparator.

29. The system of claim 27, wherein the means for measuring the period of the test signal includes at least one counter.

30. A system for determining a maximum signal propagation delay through a test circuit having a test-circuit input node and a test-circuit output node, the system comprising:

a. a signal path connected between the test-circuit input node and the test-circuit output node, wherein the signal path and the test circuit combine to form a ring oscillator providing a test signal comprised of alternating rising and falling signal transitions on a plurality of test-circuit nodes;

b. a circuit having an input terminal connected to at least one of the test-circuit nodes and adapted to determine the period of the test signal; and c. a phase discriminator having at least one phase-discriminator input node connected to at least one of the test-circuit nodes and adapted to output at least one variable for calculating the duty cycle of the test signal.

31. The system of claim 30, further comprising test circuitry adapted to calculate, from the period and duty cycle of the test signal, a first signal propagation delay for rising edges traversing the test circuit and a second signal propagation delay for falling edges traversing the test circuit.

32. The system of claim 31, wherein the signal path is an inverting signal path.

* * * * *